United States Patent
Randell

(10) Patent No.: US 10,018,693 B2
(45) Date of Patent: Jul. 10, 2018

(54) RADIOFREQUENCY COILS

(71) Applicant: PulseTeq Ltd, Chobham, Surrey (GB)

(72) Inventor: Chris Randell, Chobham (GB)

(73) Assignee: PulseTeq Ltd, Chobham (GB)

( * ) Notice: Subject to any disclaimer, the term of this patent is extended or adjusted under 35 U.S.C. 154(b) by 802 days.

(21) Appl. No.: 14/148,900

(22) Filed: Jan. 7, 2014

(65) Prior Publication Data

US 2014/0191757 A1 Jul. 10, 2014

(30) Foreign Application Priority Data

Jan. 8, 2013 (GB) .................................. 1300261.3

(51) Int. Cl.
*G01R 33/34* (2006.01)
(52) U.S. Cl.
CPC .. *G01R 33/34007* (2013.01); *G01R 33/34046* (2013.01); *Y10T 29/4902* (2015.01)
(58) Field of Classification Search
CPC . H01F 41/041–41/14; G01R 33/34046; G01R 33/34007
See application file for complete search history.

(56) References Cited

U.S. PATENT DOCUMENTS

| | | | | |
|---|---|---|---|---|
| 4,920,318 A * | 4/1990 | Misic | .............. | G01R 33/34046 324/318 |
| 5,594,339 A * | 1/1997 | Henderson | ....... | G01R 33/34084 324/318 |
| 6,788,058 B1 | 9/2004 | Petropoulos et al. | | |
| 7,560,920 B1 * | 7/2009 | Ouyang | ............... | G01N 27/902 324/240 |
| 2006/0244448 A1 * | 11/2006 | Ballon | ............. | G01R 33/34046 324/318 |
| 2007/0108980 A1 * | 5/2007 | Adriany | ........... | G01R 33/34046 324/318 |
| 2008/0157768 A1 * | 7/2008 | Lovell | .............. | G01R 33/34046 324/318 |
| 2008/0174314 A1 * | 7/2008 | Holwell | ............. | G01R 33/3415 324/318 |
| 2008/0180101 A1 * | 7/2008 | Bradshaw | ........ | G01R 33/34007 324/318 |
| 2008/0191698 A1 * | 8/2008 | Nogami | ............. | G01R 33/3873 324/318 |
| 2009/0124889 A1 | 5/2009 | Guan et al. | | |

(Continued)

FOREIGN PATENT DOCUMENTS

EP 2385385 A2 11/2011

OTHER PUBLICATIONS

Search Report in GB1300261.3 dated Feb. 14, 2014.

*Primary Examiner* — Clayton E Laballe
*Assistant Examiner* — Ruifeng Pu
(74) *Attorney, Agent, or Firm* — Manelli Selter PLLC; Edward J. Stemberger

(57) ABSTRACT

The present disclosure provides a method for producing a rigid, shaped, non-planar radiofrequency coil including:
a) placing a number of coil elements selected from one and a desired plurality of coil elements on to a flexible substrate to make a coil;
b) laying the coil flat and covering it with foam;
c) and subsequently applying the foam covered coil to a first mechanical former capable of holding the coil rigid in a desired configuration.

12 Claims, 4 Drawing Sheets

(56) References Cited

U.S. PATENT DOCUMENTS

| | | | |
|---|---|---|---|
| 2011/0054582 A1* | 3/2011 | Dabney | A61N 1/056 607/116 |
| 2011/0260727 A1* | 10/2011 | Punchard | G01R 33/3875 324/318 |
| 2013/0199028 A1* | 8/2013 | Singh | A61N 1/0553 29/602.1 |
| 2013/0205582 A1* | 8/2013 | Singh | H01F 29/02 29/602.1 |
| 2013/0320981 A1* | 12/2013 | Bulumulla | G01R 33/34084 324/318 |
| 2013/0320982 A1* | 12/2013 | Bulumulla | G01R 33/34007 324/318 |
| 2014/0070811 A1* | 3/2014 | Tomiha | G01R 33/36 324/322 |

* cited by examiner

RADIOFREQUENCY COILS

BACKGROUND

This disclosure relates to radiofrequency coils. More particularly it relates to a method for producing rigid, shaped, non-planar radiofrequency coils.

Radiofrequency coils are used in magnetic resonance imagining (MRI) scanners. These coils can be split into two types. The first are "flat" coils. These coils are typically foam covered and are substantially flat. They may be placed on the target location before a scan begins. These coils would be used for MRI scans on areas of the body such as the abdomen. The coils are lightweight but would not be used on areas where a substantially flat coil is not appropriate.

The second type of radiofrequency coils currently used are "curved" coils, which take a non-planar form. These are typically encased in hard plastics to hold the coil in the desired configuration. These coils would be used for MRI scans on areas of the body such as the head. The coils and their housing make a unit which is cumbersome and fairly heavy. If the size and shape of "curved" coil required for a particular application is not available it can be expensive and time consuming to make a coil for that application.

The current disclosure arises from our work seeking to provide non-planar "curved" coils that are lighter than prior such coils while still achieving the required rigidity and both quicker and easier to design and manufacture.

SUMMARY OF THE DISCLOSURE

According to a first aspect of this disclosure, a method for producing a rigid, shaped, non-planar radiofrequency coil comprises the steps of: placing a number of coil elements selected from one and a desired plurality of coil elements on to a flexible substrate to make a coil; laying the said coil flat and covering it with foam; and subsequently applying the said foam covered coil to a first mechanical former capable of holding the said coil rigid in a desired configuration.

The foam can be applied by a thermoforming method using moulds or by a layered method using foam and adhesives. Using either method we have found that an appropriate foam to use would be a bio-compatible, cross-linked block foam. Applicant has found that suitable foams include bio-compatible PLASTAZOTE® and EVAZOTE® Foams available from Zotefoams Plc.

The step of applying the foam covered coil to a first mechanical former may be irreversible.

In an alternative embodiment the step of applying the foam covered coil to a first mechanical former may be reversible. The coil may be removed from the mechanical former using a quick release mechanism.

The method optionally includes additional steps carried out prior to the step of laying the coil flat and applying foam but subsequent to the step of placing a number of coil elements on to a flexible substrate to make a coil, the optional steps comprising: fitting the coil into a former, which may be the first mechanical former or a different former capable of holding the coil rigid and in the same shape as the first mechanical former; while the coil is held in said former, undertaking a radiofrequency set-up to optimise the radiofrequency characteristics of the coil for the target application.

This radiofrequency set-up may include obtaining the best coil Q factor; ensuring that the coil has the most suitable unloaded resonance determined by measurement of the circuit's quality factor; ensuring that the coil is tuned at the nuclear magnetic resonance (NMR) frequency when loaded by the object that is to be the subject of the magnetic resonance (MR) scan; ensuring that in a multi-element design the coil has good radiofrequency isolation from other elements; ensuring that the coil is matched to the output circuitry such that, in the case of a receive coil, the signal detected has optimum signal to noise ratio, and, in the case of a transmit coil, that the coil produces an optimum radiofrequency field for a given radiofrequency power output from an associated amplifier.

The method may include a preliminary step performed prior to any of the foregoing steps, the preliminary step comprising: designing a former capable of holding a flexible coil in a rigid shape, this rigid shape being the shape required for the final coil. The former may be generally cylindrical in a mathematical sense with a uniform cross-section along its axis, but with that cross-section being circular, oval or irregular. Alternatively the former may be curved but not closed, such that the coil is held in a U- or C-shape. The former may also be designed to extend significantly in two dimensions while having only a low profile in the third dimension.

The coil may be provided with protrusions capable of reversibly locking into fixing locations on said former such that when the said protrusions are locked into the fixing locations the coil is held rigid in the desired configuration in the said former, the protrusions being designed to extend outside the sections of the coil that are foam covered. The protrusions may be provided on one or more edges of the coil and may be permanently attached to the coil. Alternatively the protrusions may be removed from the coil for the foam covering step and attached once the coil is covered in foam. The protrusions may be slid into mating parts on the coil or be screwed onto the coil through holes in the foam.

According to a second aspect of this disclosure, there is provided: a rigid, shaped, non-planar radiofrequency coil, the coil comprising a foam covered coil held rigid and in a desired conformation by a mechanical former.

The coil may be provided on a printed circuit board (PCB). This allows components to be flow soldered on to the PCB.

The PCB may comprise a plurality of flat sections joined by flexible PCB material or may be a completely flexible, or may comprise a first section comprising a plurality of flat sections joined by flexible PCB material and a second section that is completely flexible.

The coil may be provided separately from a preamplifier, such that a single set of preamplifiers may be used with several different sets of coils.

The mechanical former may be designed from a rigid material that is compatible with the coil and an MRI scanner. This rigid material could be formed from rapid prototype plastics material, vacuum cast material, injection moulded material, rim cast material, plastics machine cut parts, stiff foam pieces and/or a stiff plastics foam.

The mechanical former may be shaped to allow the coil to be used on a person's head and or neck, the mechanical former being part of a frame which supports the said person's head and neck and the coil being removable from the frame without moving the person's head.

Alternatively the mechanical former may be shaped to allow the coil to cover a focused region such as a person's forehead, the mechanical former being part of a frame that stabilises the said person's head and may provide a visual display to the person by means of goggles or mirrors.

The coil may be capable of splitting into sections.

The coil may be made of more than one coil where each coil is for imaging nuclei of different chemical elements.

The coil may be a transmit coil, whereby the coil transmits the radiofrequency into the target region. Alternatively the coil may be a receive coil, whereby the coil receives the NMR signal. Alternatively the coil may be a transmit/receive coil, whereby the coil both transmits and receives the NMR signal. Alternatively the coil may be made up of more than one coil element where one coil element is for transmitting radiofrequency waves and another coil element is for receiving radiofrequency waves.

The coils may include at least one fiduciary marker incorporated into the final structure, where a fiduciary marker is an object placed in the field of view of the coil which appears in the final image produced and can be used as a point of reference.

The coils may include reference samples incorporated into the final structure.

The foam may be non-conducting.

Alternatively the foam may include a conducting foam layer which can be used as a conducting radiofrequency screen.

The foam covering may be designed to act as an enclosure for additional components of the radiofrequency coil. These components may include, but are not limited to, preamplifiers, PIN diode controllers, radiofrequency circuitry for transmit/receive switching (T/R switches), radiofrequency combiners, radiofrequency splitters, quadrature combiners.

The coil produced may be of any radiofrequency coil type that may be used in MR scanners. Such coil types include, but are not limited to, single element coils, multi-element coils, birdcage coils, transverse electromagnetic (TEM) coils and microstrip coils.

BRIEF DESCRIPTION OF THE DRAWINGS

Reference may now be made to the description of preferred embodiments by way of example only with reference to the accompanying drawings, in which.

DESCRIPTION OF PREFERRED EMBODIMENTS

Figure 1:
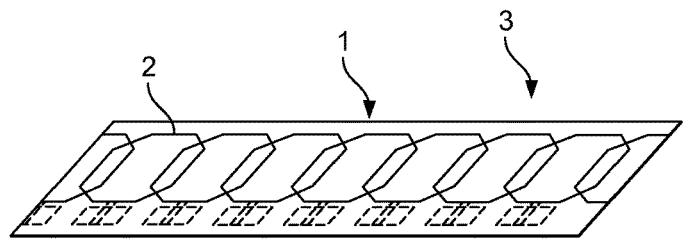
FIG. 1 is a perspective view of a printed circuit board with eight elements.
Figure 2:
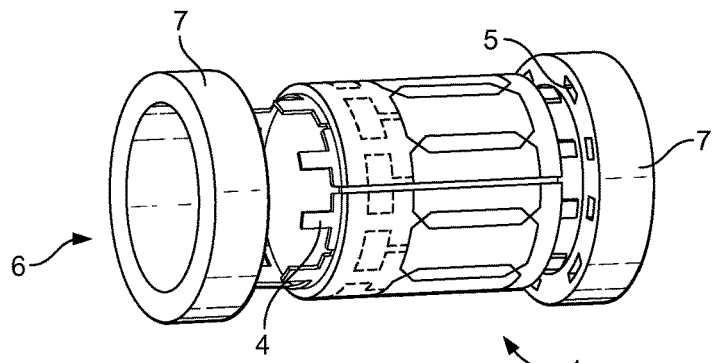
FIG. 2 is an exploded, perspective view of the printed circuit board of FIG. 1 with two end rings.
Figure 3:
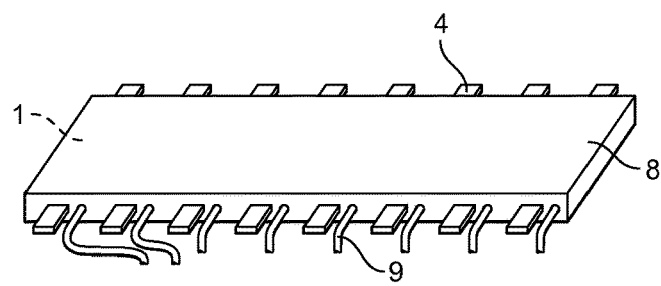
FIG. 3 is a perspective view of the printed circuit board of FIG. 1 covered in foam.

A printed circuit board 1 is provided with eight elements 2 which make up a radiofrequency coil 3. The printed circuit board is fitted with protrusions 4 and then curved such that the protrusions 4 lock into corresponding slots 5 in a mechanical former 6. Here the mechanical former comprises two end rings 7. The mechanical former 6 is capable of holding the printed circuit board 1 in a rigid configuration.

While the printed circuit board 1 is held in the mechanical former 6 a radiofrequency set-up is undertaken to optimise the radiofrequency characteristics of the coil for the target application. This optimisation can involve obtaining the best coil Q factor; ensuring that the coil 3 has the most suitable unloaded resonance, determined by measurement of the circuit's quality factor; ensuring that the coil 3 is tuned at the nuclear magnetic resonance (NMR) frequency when loaded by the object that is to be the subject of the magnetic resonance (MR) scan; ensuring that in a multi-element design the coil 3 has good radiofrequency isolation from other elements; ensuring that the coil 3 is matched to the output circuitry such that, in the case of a receive coil, the signal detected has optimum signal to noise ratio, and, in the case of a transmit coil, that the coil 3 produces an optimum radiofrequency field for a given radiofrequency power output from an associated amplifier.

When the radiofrequency set-up is complete, the printed circuit board 1 is removed from the mechanical former, laid flat and covered in foam 8. The foam 8 can be applied by a thermoforming method using moulds or by a layered method using foam and adhesives. Using either method, we have found that an appropriate foam 8 to use would be a bio-compatible, cross-linked block foam such as bio-compatible PLASTAZOTE® or EVAZOTE® Foam available from Zotefoams Plc The protrusions 4 extend out of the foam 8 as do cables 9 associated with each element 2.

Figure 4:
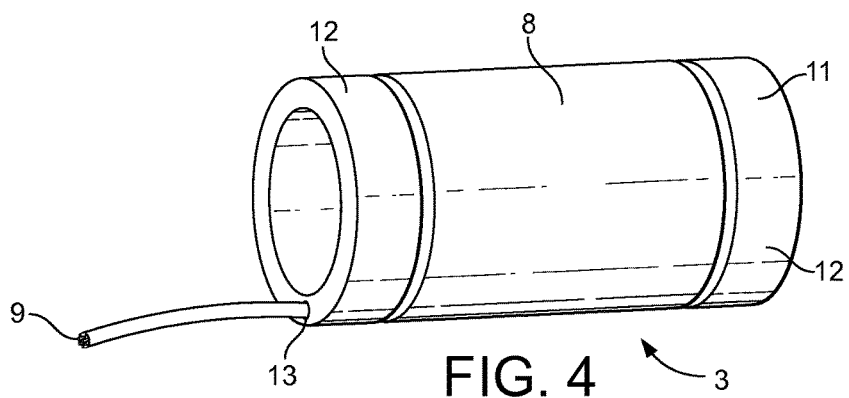
FIG. 4 is a perspective view of the foam covered printed circuit board of FIG. 3 fitted into two end rings.

The foam-covered coil 3 is then fitted into a further mechanical former 11 which comprises two end rings 12 and holds the printed circuit board 1 in a rigid configuration identical to the configuration it was held in by the previous mechanical former 6. The cables 9 are guided through the mechanical former 11 to an exit point 13. As shown in FIG. 4, the result is effectively a rigid cylindrical RF coil.

Figure 5:
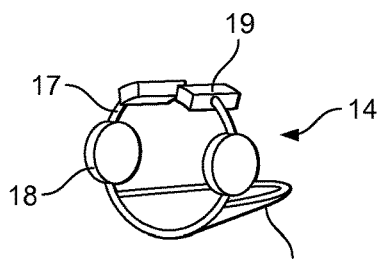
FIG. 5 is a perspective view of a head support.

Sometimes it is necessary to obtain an MRI scan of a subject's head. For that purpose a foam-coated coil 20 can be used with a head support 14. The head support 14 shown in FIG. 5 has a head rest 15, on which a subject may simply lay their head. However, if required, additional fixings could be provided which will hold a subject's head more securely. The head support 14 is provided with a ring 17 large enough to encircle a subject's head. The ring 17 provides support for ear defenders 18 and video goggles or mirrors 19 to protect both the subject's ears and eyes when they are in the support. The ear defenders 17 may be provided with head phones so the subject may listen to music or hear communications from doctors and technicians while using the head support 14.

Figure 6:
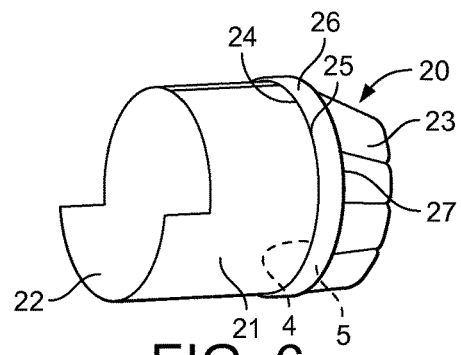
FIG. 6 is a perspective view of a coil and former that could be used with the head support of FIG. 5.

A coil 20 which will be used with the head support 14 could be made in many shapes and sizes. The key requirement is that the coil 20 must be capable of being fitted to the support 14 without the subject having to move their head or the support 14 being adjusted. A suitable arrangement is shown in FIG. 6 where the coil 20 is formed from two side pieces 21 and 22 and eight top pieces 23. The left side piece 21 is a mirror image of the right side piece 22. Both side pieces 21 and 22 have a top edge 24 which is provided with protrusions 4. The protrusions 4 are capable of locking into corresponding slots 5 which are provided on bottom side 25 of a support ring 26. The support ring 26 is capable of holding the side pieces 21 and 22 so that together they are held in a cylindrical configuration. The two side pieces 21 and 22 are shaped such that, when used with the head support 14, the side pieces will stop short of the ear defenders 18 and video goggles or mirrors 19. Top side 27 of the support ring 26 is provided with slots 5 which correspond to protrusions 4 which are provided on the eight top pieces 23. When correctly fitted to the support ring 26 and connected to each other by further protrusions 4 and slots 5, the top pieces 23 are held in a domed configuration which in use will cover the top of a subject's head. The side pieces 21 and 22 and the top pieces 23 are connected electronically. The coil 20 is capable of being assembled round the head support 14 when it is in use supporting a subject's head. It will be appreciated that this process involves a coil that can be laid flat for component placement and foam covering, but is subsequently shaped by support ring 26 into the required essentially rigid cylindrical shape, such that it surrounds the subject's head.

Figure 7:
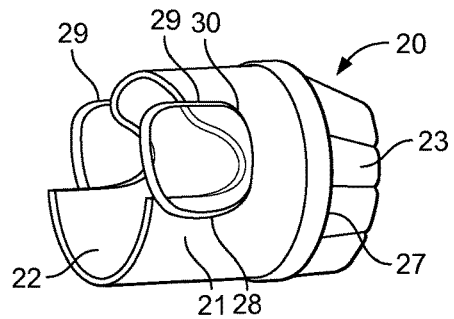
FIG. 7 is a perspective view of a further coil and former that could be used with the head support of FIG. 5.

If coil 20 is required to extend below the ear defenders 18, it may include a hinged section 28. This hinged section 28 may be placed on one or both side sections 21, 22. In FIG. 7 it is shown on both side sections 21 and 22. The hinged section 28 will comprise a looped piece 29 which is attached to a side section 21 or 22 by a hinge 30. The looped piece 29 will be electronically connected to the rest of the coil 20. The hinged section 28 enables the hinge 30 to be in the open position while the coil 20 is being fitted around a head support 14 and then locked into the closed position before imaging commences.

While not shown, it will readily be appreciated by a person skilled in the art that further hinged sections may be provided which cover the video goggles or mirrors 19. This will allow for a greater imaging coverage of the brain and the eyes themselves.

Figure 8:
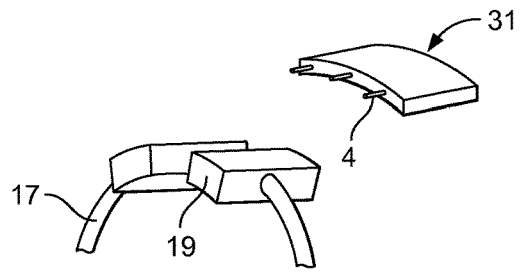
FIG. 8 is a perspective view of a further coil and former that could be used with the head support of FIG. 5.

If it was only required that a small section of the subject's head be scanned then it will be readily appreciated that a much smaller coil 31 would be sufficient. FIG. 8 shows a coil 31 fitted with protrusions 4 which are capable of clipping into corresponding slots 5 provided on the video goggles or mirrors 19 on the head support 14. Such a coil would be capable of localised coverage of the forehead or occipital lobe of the subject.

The assembly can be permanently held in its desired rigid shape. Alternatively the method which fixes the assembly in its desired rigid shape can be reversible. In this reversible approach, the coil 20 is positioned flat while the subject's head is positioned in the head support 14, ear defenders 18 and video display 19. The coil 20 is then shaped around the head and fixed in place using the support ring 26. A quick release mechanism allows the coil 20 to be laid flat before the subjects head is removed from the support 14. The quick release mechanism could be made to open the coil 20 quickly, should the subject's head need to be removed in an emergency.

Any suitable quick release mechanism can be used. This may include but is not limited to hook and loop fasteners strips or poppers.

Figure 9:
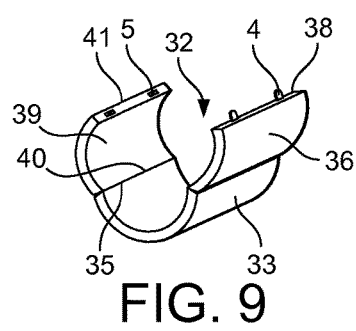
FIG. 9 is a perspective view of a coil where the end rings are hinged.
Figure 10:
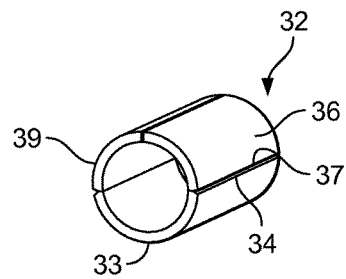
FIG. 10 is a further perspective view of the coil of FIG. 9.

These coils can be made in a variety of shapes and sizes to suit whatever purpose they are intended to be used for. For instance, a cylindrical coil 32 (FIG. 9) could be used for imaging a subject's arm or leg. The coil 32 is made from three sections. A base section 33 has a semi-circular cross section, a first longitudinal edge 34, and a second longitudinal edge 35. A first hinged section 36 has a quarter of a circle cross-section, a first longitudinal edge 37, and a second longitudinal edge 38. The first edge 34 of the base section 33 is hinged to the first edge 37 of the first hinged section 36. The second edge 38 of the first hinged section 36 is provided with protrusions 4. A second hinged section 39 has the same cross-section as the first hinged section 36 and has a first longitudinal edge 40 and a second longitudinal edge 41. The second edge 35 of the base section 33 is hinged to the first edge 40 of the section hinged section 39. The second edge 41 of the second hinged section 39 is provided with slots 5 which correspond to the protrusions 4 located on the second edge 38 of the first hinged section 36. When the hinged sections 36 and 39 are closed, as illustrated in FIG. 10, the coil 32 is cylindrical.

Figure 11:
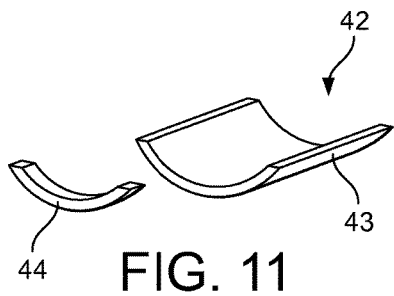
FIG. 11 shows an exploded, perspective view of a C- or U-shaped coil with a suitable former.

A coil 42 (FIG. 11) could also be C- or U-shaped if the foam covered printed circuit board 43 is provided with a C- or U-shaped end rings 44.

Figure 12:
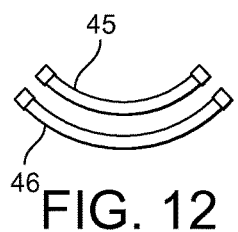
FIG. 12 shows an exploded, end view of two coils which fit one inside the other.
Figure 13:
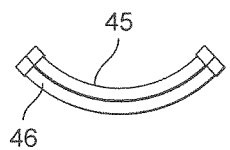
FIG. 13 shows an end view of the two coils from FIG. 12.

It will be readily appreciated that this technology could be used for two coils where a first coil 45 is positioning inside a second coil 46. The two separate coils 45 and 46 may be covered in foam 8 together or, as shown in FIGS. 12 and 13, separately. When the radiofrequency set-up is undertaken it will include a step of ensuring that there is good isolation between the coils. This approach can be used when the two coils operate at two different frequencies targeting different nuclei or can be used when the coils operate at the same frequency and known techniques are used to isolate the coils from each other during use. For example the first coil 45 may be set-up to transmit and be detuned to receive and the second coil 46 may be set-up to receive and detuned to transmit.

Figure 14:
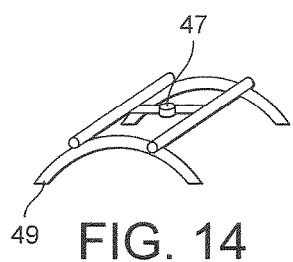
FIG. 14 shows a perspective view of a former that may also house reference samples and/or fiducials.
Figure 15:
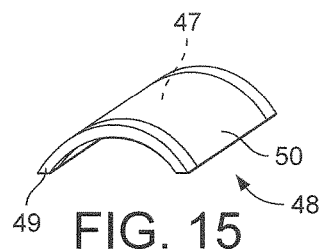
FIG. 15 shows a perspective view of the former of FIG. 14 with coils attached.

Sometimes it is desired to include reference samples 47 in a coil 48. This can be achieved by mounting the reference sample 47 on to a housing 49 (FIG. 14) such that when a foam covered printed circuit board 50 is also mounted to the housing 49, as shown in FIG. 15, the reference sample 47 is in the desired position in the coil 48.

Figure 16:
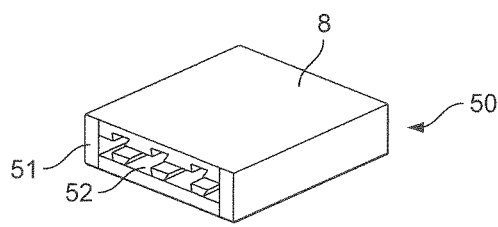
FIG. 16 shows a perspective view of a foam enclosure with one open side.
Figure 17:
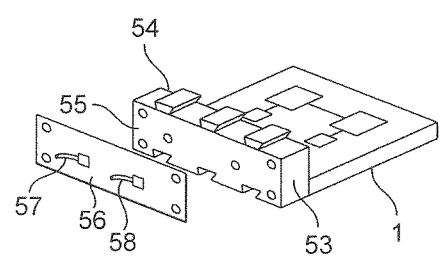
FIG. 17 shows a perspective view of a printed circuit board and cover to be used in conjunction with the foam enclosure of FIG. 16.

As explained above, a required step in creating coil 3 is to cover the printed circuit board 1 in foam 8. This can be achieved, as shown in FIGS. 16 and 17, by making an enclosure 50 out of foam 8 where one side 51 is provided with a keyed opening 52, and by providing a cover 53 corresponding to the keyed opening 52. Cover 53 has a first side 54 and a second side 55 where the first side 54 is parallel to the second side 55. The printed circuit board 1 is attached to the first side 54 of the cover 53. A plate 56, suitably formed of plastics material, may be added to the second side 55 for improved security and for mounting connectors. Respective input 57 and output 58 cables will also be mounted to the plastic plate 56. The printed circuit board 1 is capable of being slid into the enclosure 50 so that the cover 53 slots into the keyed opening 52, the enclosure 50 thereby covering the printed circuit board 1.

While not shown in the drawings, it will be readily understood by a person skilled in the art that the step of covering the printed circuit board 1 in foam 8 may also be achieved using a thermoforming method using moulds or by a layered method using foam and adhesives.

Different electronic modules may be housed in individual foam housings and then built into single or multilayer structures. These can in turn be housed in a final sealed foam case as desired.

The invention claimed is:

1. A method for producing a rigid, shaped, non-planar radiofrequency coil comprising the steps of:
    placing a number of coil elements selected from one and a desired plurality of coil elements on to a flexible substrate to make a coil;
    fitting the coil into a first mechanical former capable of holding the coil rigid in a desired configuration;
    while the coil is held in said former, undertaking a radiofrequency set-up to optimise the radiofrequency characteristics of the coil for a target application;
    laying the said coil flat and covering it with foam; and
    subsequently applying the said foam covered coil to the first mechanical former or a different former capable of holding the said coil rigid in the desired configuration thereby defining the rigid, shaped, non-planar radiofrequency coil.

2. A method according to claim 1, wherein the step of applying the foam covered coil to a first mechanical former is irreversible.

3. A method according to claim 1, wherein the step of applying the foam covered coil to a first mechanical former is reversible and the coil may be removed from the mechanical former using a quick release mechanism.

4. A method according to claim 1, wherein the radiofrequency set-up includes at least one of obtaining the best coil Q factor; ensuring that the coil has the most suitable unloaded resonance determined by measurement of the circuit's quality factor; ensuring that the coil is tuned at the nuclear magnetic resonance (NMR) frequency when loaded by the object that is to be the subject of the magnetic resonance (MR) scan; ensuring that in a multi-element design the coil has good radiofrequency isolation from other elements; ensuring that the coil is matched to the output circuitry such that, in the case of a receive coil, the signal detected has optimum signal to noise ratio, and, in the case of a transmit coil, that the coil produces an optimum radiofrequency field for a given radiofrequency power output from an associated amplifier.

5. A method according to claim 1, wherein the method includes a preliminary step performed prior to the placing step, the preliminary step comprising: designing a former capable of holding a flexible coil in a rigid shape, this rigid shape being the shape required for the final coil.

6. A method according to claim 5, wherein the former is designed to be generally cylindrical in a mathematical sense with a uniform cross-section along its axis.

7. A method according to claim 6, wherein that cross-section is one of circular, oval or irregular.

8. A method according to claim 5, wherein the former is designed to be curved but not closed, such that the coil is held in a U- or C-shape or to extend significantly in two dimensions while having only a low profile in the third dimension.

9. A method according to claim 1, wherein the coil is provided with protrusions capable of reversibly locking into fixing locations on said former such that when the said protrusions are locked into the fixing locations the coil is held rigid in the desired configuration in the said former, the protrusions being designed to extend outside the sections of the coil that are foam covered.

10. A method according to claim 9, wherein the protrusions are provided on one or more edges of the coil and are permanently attached to the coil.

11. A method according to claim 9, wherein the protrusions may be removed from the coil for the foam covering step and attached once the coil is covered in foam.

12. A method according to claim 11, wherein the protrusions will be slid into mating parts on the coil or screwed onto the coil through holes in the foam.

* * * * *